US012680500B2

(12) United States Patent (10) Patent No.: US 12,680,500 B2
Cçkala et al. (45) Date of Patent: Jul. 14, 2026

(54) IDENTIFICATION MODULE FOR TURBINE ENGINE OR AUXILIARY POWER UNIT WITH EXTENDED DATA STORAGE CAPACITY

(71) Applicant: Pratt & Whitney Canada Corp., Longueuil (CA)

(72) Inventors: Kamil Cçkala, Przemyśl (PL); Dennis Schmidt, Incline Village, NV (US)

(73) Assignee: PRATT & WHITNEY CANADA CORP., Longueuil (CA)

( * ) Notice: Subject to any disclaimer, the term of this patent is extended or adjusted under 35 U.S.C. 154(b) by 313 days.

(21) Appl. No.: 18/159,834

(22) Filed: Jan. 26, 2023

(65) Prior Publication Data

US 2024/0254918 A1 Aug. 1, 2024

(51) Int. Cl.
| | |
|---|---|
| *F02C 9/00* | (2006.01) |
| *B64D 31/04* | (2006.01) |
| *B64D 41/00* | (2006.01) |
| *F02C 7/057* | (2006.01) |
| *F02C 9/28* | (2006.01) |
| *G05B 19/418* | (2006.01) |
| *G05B 23/02* | (2006.01) |
| *G06F 18/21* | (2023.01) |
| *G06N 3/044* | (2023.01) |
| *G06N 20/00* | (2019.01) |

(Continued)

(52) U.S. Cl.
CPC .............. *F02C 7/057* (2013.01); *B64D 31/04* (2013.01); *B64D 41/00* (2013.01); *F02C 9/00* (2013.01); *F02C 9/28* (2013.01); *G05B 19/4183* (2013.01); *G05B 19/41845* (2013.01);

*G05B 19/41865* (2013.01); *G05B 23/0221* (2013.01); *G06F 18/2178* (2023.01); *G06N 3/044* (2023.01); *G06N 20/00* (2019.01); *H04L 67/12* (2013.01); *F05D 2220/50* (2013.01); *F05D 2260/80* (2013.01); *F05D 2260/83* (2013.01); *H10B 63/00* (2023.02)

(58) Field of Classification Search
CPC ........ G06N 20/00; G06N 3/044; H04L 67/12; G05B 19/4183; G05B 19/41865; G05B 19/41845; G05B 23/0221; G06F 18/2178; F02C 7/057; F02C 9/00; F02C 9/28; H10B 63/00; F05D 2220/50; F05D 2260/80; F05D 2260/83; B64D 31/04; B64D 41/00
See application file for complete search history.

(56) References Cited

U.S. PATENT DOCUMENTS

| | | | |
|---|---|---|---|
| 5,033,010 A * | 7/1991 | Lawrence | .......... G05B 23/0264 346/33 TP |
| 5,146,172 A | 9/1992 | Mehr-Ayin et al. | |

(Continued)

OTHER PUBLICATIONS

Microchip, Digital Potentiometers Design Guide (2016), Microchip Technology Inc., All (Year: 2016).*

(Continued)

*Primary Examiner* — Jason H Duger
(74) *Attorney, Agent, or Firm* — CANTOR COLBURN LLP

(57) ABSTRACT

Examples described herein provide an aircraft that includes an auxiliary power unit, a controller, and an identification module. The identification module includes a plurality of digital potentiometers to store information about the auxiliary power unit and readable by the controller.

15 Claims, 5 Drawing Sheets

(51) Int. Cl.
  *H04L 67/12* (2022.01)
  *H10B 63/00* (2023.01)

(56) References Cited

U.S. PATENT DOCUMENTS

| | | | |
|---|---|---|---|
| 6,744,277 B1 * | 6/2004 | Chang | H03L 7/0896 |
| | | | 326/82 |
| 7,325,401 B1 * | 2/2008 | Kesseli | F02C 1/05 |
| | | | 60/677 |
| 8,170,836 B1 | 5/2012 | Champaigne et al. | |
| 11,018,186 B2 | 5/2021 | Lesso | |
| 11,696,452 B2 | 7/2023 | Lesso et al. | |
| 11,705,922 B2 | 7/2023 | Myers | |
| 2003/0187554 A1 * | 10/2003 | Henry | G07C 5/008 |
| | | | 702/183 |
| 2007/0236852 A1 | 10/2007 | Plivcic | |
| 2010/0275575 A1 * | 11/2010 | Brown | F02C 9/00 |
| | | | 60/233 |

OTHER PUBLICATIONS

Analog Devices, Resolution Enhancements of Digital Potentiometers with Multiple Devices (2001), AN-582, All (Year: 2001).*

Analog Devices, Digital Potentiometers (2009), Analog Devices, MT-091, All (Year: 2009).*

Cutkosky; "A New Switching Technique for Binary Resistive Dividers"; IEEE Transactions on Instrumentation and Measurement; vol. IM-27, No. 4; Dec. 1978; pp. 421-422.

Madni et al., "Aerospace Technology and Low Automotive Costs Benefit Quartz Micromachined Gyros" 57th AM—Proceedings of the 57th Annual Meeting of the Institute of Navigation, The Institute of Navigation (Jun. 2001) pp. 205-218.

Search Report issued in European Patent Application No. 24153520. 2; Application Filing Date Jan. 23, 2024; Date of Mailing Sep. 6, 2024 (9 pages).

* cited by examiner

IDENTIFICATION MODULE FOR TURBINE ENGINE OR AUXILIARY POWER UNIT WITH EXTENDED DATA STORAGE CAPACITY

BACKGROUND

The subject matter disclosed herein generally relates to turbine engines and auxiliary power units (APUs) for aircraft and particularly to an identification module for a turbine engine or APU with extended data storage capacity.

Aircraft can include one or more turbine engines, such as gas turbine engines and hybrid electric turbine engines, to generate thrust and propel the aircraft. Aircraft can also include one or more APUs to generate electrical power to power components of the aircraft and/or to provide start-up assistance to the turbine engine(s).

BRIEF DESCRIPTION

In one exemplary embodiment, an aircraft is provided. The aircraft includes an auxiliary power unit, a controller, an identification module. The identification module includes a plurality of digital potentiometers to store information about the auxiliary power unit and readable by the controller.

In addition to one or more of the features described herein, or as an alternative, further embodiments of the aircraft may include that the plurality of digital potentiometers are arranged in a parallel configuration.

In addition to one or more of the features described herein, or as an alternative, further embodiments of the aircraft may include that the plurality of digital potentiometers are arranged in a series configuration.

In addition to one or more of the features described herein, or as an alternative, further embodiments of the aircraft may include that the plurality of digital potentiometers includes a first subset of digital potentiometers connected in parallel with each other and a second subset of potentiometers connected in series with each other wherein the first subset is connected in parallel with the second subset.

In addition to one or more of the features described herein, or as an alternative, further embodiments of the aircraft may include that at least one of the plurality of digital potentiometers is a reprogrammable digital potentiometer, and wherein at least one other of the plurality of digital potentiometers is a fusible digital potentiometer.

In addition to one or more of the features described herein, or as an alternative, further embodiments of the aircraft may include that at least one of the plurality of digital potentiometers stores a serial number associated with the auxiliary power unit, and wherein at least one other of the plurality of digital potentiometers stores dynamic information associated with the auxiliary power unit.

In addition to one or more of the features described herein, or as an alternative, further embodiments of the aircraft may include that the dynamic information associated with the auxiliary power unit is an exhaust gas temperature trim or a torque trim.

In one exemplary embodiment, a system is provided. The system includes a turbine engine of an aircraft, a controller, and an identification module. The identification module includes a plurality of digital potentiometers to store information about the turbine engine of the aircraft and readable by the controller.

In addition to one or more of the features described herein, or as an alternative, further embodiments of the system may include that the plurality of digital potentiometers are arranged in a parallel configuration.

In addition to one or more of the features described herein, or as an alternative, further embodiments of the system may include that the plurality of digital potentiometers are arranged in a series configuration.

In addition to one or more of the features described herein, or as an alternative, further embodiments of the system may include that the plurality of digital potentiometers includes a first subset of digital potentiometers connected in parallel with each other and a second subset of potentiometers connected in series with each other wherein the first subset is connected in parallel with the second subset.

In addition to one or more of the features described herein, or as an alternative, further embodiments of the system may include that at least one of the plurality of digital potentiometers is a reprogrammable digital potentiometer, and wherein at least one other of the plurality of digital potentiometers is a fusible digital potentiometer.

In addition to one or more of the features described herein, or as an alternative, further embodiments of the system may include that at least one of the plurality of digital potentiometers stores a serial number associated with the turbine engine, and wherein at least one other of the plurality of digital potentiometers stores dynamic information associated with the turbine engine.

In addition to one or more of the features described herein, or as an alternative, further embodiments of the system may include that the dynamic information associated with the turbine engine is an exhaust gas temperature trim or a torque trim.

The above features and advantages, and other features and advantages, of the disclosure are readily apparent from the following detailed description when taken in connection with the accompanying drawings.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
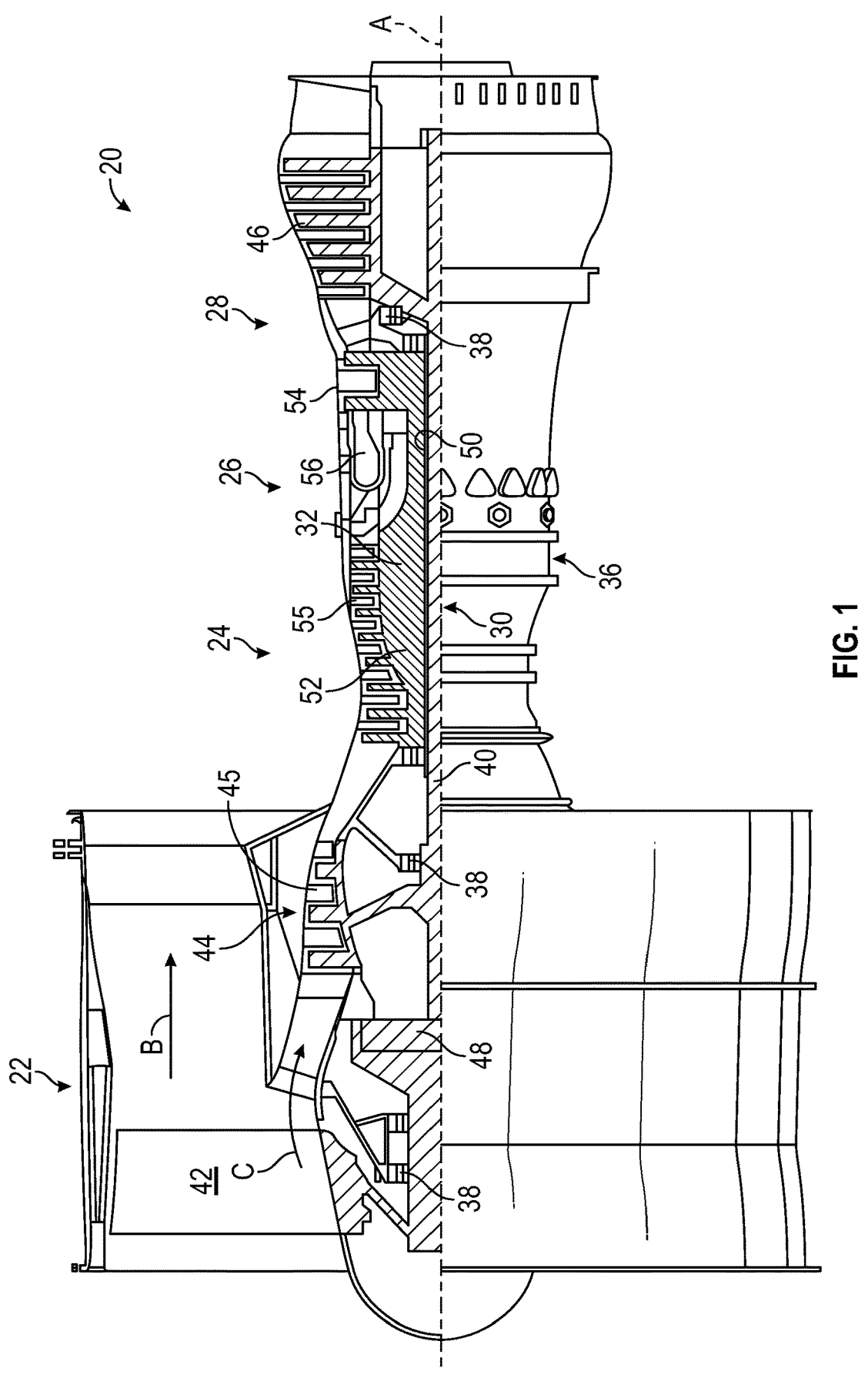
FIG. 1 is a partial cross-sectional illustration of a gas turbine engine, in accordance with an embodiment of the disclosure.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a low pressure compressor 44 and a low pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged in exemplary gas turbine 20 between the high pressure compressor 52 and the high pressure turbine 54. An engine static structure 36 is arranged generally between the high pressure turbine 54 and the low pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. In some embodiments, stator vanes 45 in the low pressure compressor 44 and stator vanes 55 in the high pressure compressor 52 may be adjustable during operation of the gas turbine engine 20 to support various operating conditions. In other embodiments, the stator vanes 45, 55 may be held in a fixed position. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present disclosure is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10,688 meters). The flight condition of 0.8 Mach and 35,000 ft (10,688 meters), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(\text{Tram} \,^{\circ} \, R)/(518.7^{\circ} \, R)]^{0.5}$. The "Low corrected fan tip speed" as disclosed herein according to one non-limiting embodiment is less than about 1150 ft/second (350.5 m/sec).

While the example of FIG. 1 illustrates one example of the gas turbine engine 20, it will be understood that any number of spools, inclusion or omission of the gear system 48, and/or other elements and subsystems are contemplated. For example, the gas turbine engine 20 can include a turbojet engine that does not include a gear system 48 and/or bypass flow path B. Further, rotor systems described herein can be used in a variety of applications and need not be limited to gas turbine engines for aircraft applications. For example, rotor systems can be included in power generation systems, which may be ground-based as a fixed position or mobile system, and other such applications.

Figure 2:
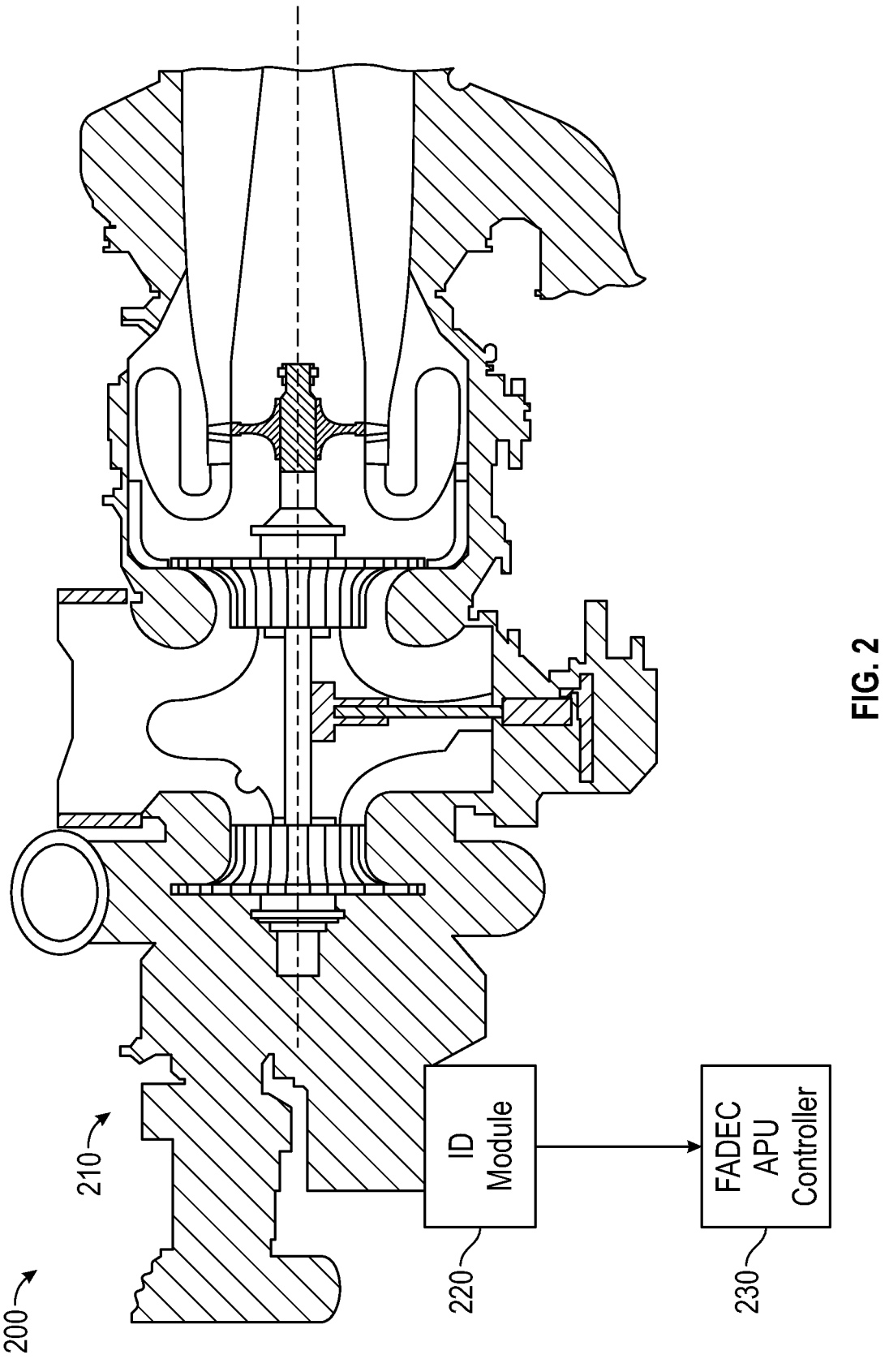
FIG. 2 is a block diagram of a system according to one or more embodiments described herein.

FIG. 2 is a block diagram of a system 200 according to one or more embodiments described herein. The system 200 includes an APU 210, an ID module 220, and a full authority digital engine control (FADEC) APU controller 230. It should be appreciated that, in one or more embodiments, the APU 210 can be a turbine engine, such as the gas turbine engine 20 of FIG. 1. The ID module 220 stores information characterizing the ID of the APU 210 and/or turbine engine performance constraints used by FADEC APU controller 230 and calibrated for the APU 210 for each APU serial number during a pass-off test. The FADEC APU controller 230 controls aspects of aircraft engine performance, such as performance of the APU 210. Although not shown, the FADEC APU controller 230 can include an electronic engine controller (EEC).

Conventionally, prior the implementation of data memory modules, legacy aircraft APU and propulsion turbine engines used external resistance devices to store constants input information to the EEC. Information stored in these devices included torque trim values in turboshaft and turboprop engines, exhaust gas temperature (EGT) trim values, or turbine engine serial numbers. This type of information is typically a constant, that is determined during APU or turbine engine calibration at pass-off test (e.g., torque trim), or an arbitrarily defined number (e.g., serial number, ID number to distinguish between configurations, etc.). Information was coded in resistance value using a look-up table, formula, or in binary format. Resistance was then read by the analog input interface of the EEC and decoded to recreate the original information.

A conventional ID module is APU/engine mounted (e.g., the ID module is tied to the APU/engine) as the ID module contains the information that is characterizing either the ID of the APU/engine and/or turbine engine performance constants used by the control system and calibrated for each APU/engine serial number during pass-off test. In the APU case, typically the FADEC APU controller 230 is installed remotely to the APU 210 and reads the data from the ID module 220 and re-writes it to a memory (e.g., electrically erasable programmable read-only memory (EEPROM)) of the FADEC APU controller 230.

A conventional ID module can store information using resistors. In one configuration, a series of resistors can be used to store binary information in a string of "k" bits, with each resistor having a discrete resistance value (e.g., R, 2R, 4R, 8R). This configuration is useful for storing the serial number of the APU 210, for example. In another configuration, a variable resistance resistor can be used to store decimal information coded in analog format as resistance ranging from Rmin to Rmax. This configuration is useful for storing coded torque trims or EGT trims, for example.

In either of these configurations, the EEC analog input reads the resistance, and the EEC software decodes the stored information as a function of resistance. Programming of the ID module 220 is based on either manually cutting the printed circuit board (PCB) traces as per the coding look-up table or installing precision resistors of given value. These efforts typically involve significant amount of workmanship both in production and in the aftermarket services. Reprogramming essentially translates into replacing hardware. Moreover, should an error be made during programming, typically the entire PCB is scrapped. This is driving a significant demand of inventory of spare ID modules. It can be inferred that the maximum information storage capacity in the case of binary data format is driven by the number of bits which directly translates into the number of resistors. Assuming the lines resistance are coded in a binary format, this results in (n*k) number of bits with every bit being realized by a resistor with a mechanism allowing to short circuit this resistor to set the bit to false.

APUs and turbine engines using the legacy control systems with EEC input constants stored as resistance values are still in production and widely used. With the existing circuit topology, typically at some point in the APU or turbine engine lifecycle, the storage capacity of the ID module 220 can be entirely utilized not allowing for, for example, coding a desired range of serial numbers. Moreover, throughout APU or turbine engine lifecycle, a demand may exist for continuous product improvement, including adding new functionalities. In such a case, a need exists to add a provision for storing more input data (e.g., add identification flags to differentiate between legacy and upgraded model and/or EGT trims, etc.) At this stage, the APU or turbine engine manufacturer may decide to upgrade the control system to add a modern data storage device, such as a digital data memory module (DMM) for example. However this approach may be impractical as typically legacy EECs have some hardware limitations, such as lack of spare ARINC/UART data bus to hook-up the DMM. In such a case using a more modern EEC would be useful, which translates into APU or turbine engine major change and re-certification of the APU or turbine engine with a new electronic controller. Cost of a major re-certification on a mature legacy APU or turbine engine may be prohibitive or impractical.

One approach to this shortcoming of conventional ID modules is to increase the data storage capacity of the existing ID module and modify EEC software to accept the extended data. However the data storage capacity of conventional ID modules is solely dependent on the circuit topology and part count. Hence, the increase in data storage capacity inadvertently increases ID module part count driving reliability reduction. It also increases the complexity of programming and the involved workmanship.

One or more embodiments described herein address these and other shortcomings by providing an improved identification module for a turbine engine or APU with extended data storage capacity. One or more embodiments provide for extending the data storage capacity of the ID module using modern electronic components, which can be retrofitted to an existing APU or turbine engine electronic control system with no need to recertify the system itself. One or more embodiments use a commercial off the shelf (COTS) digital potentiometer instead of and/or in addition to a resistor(s) to store information.

Figure 3:
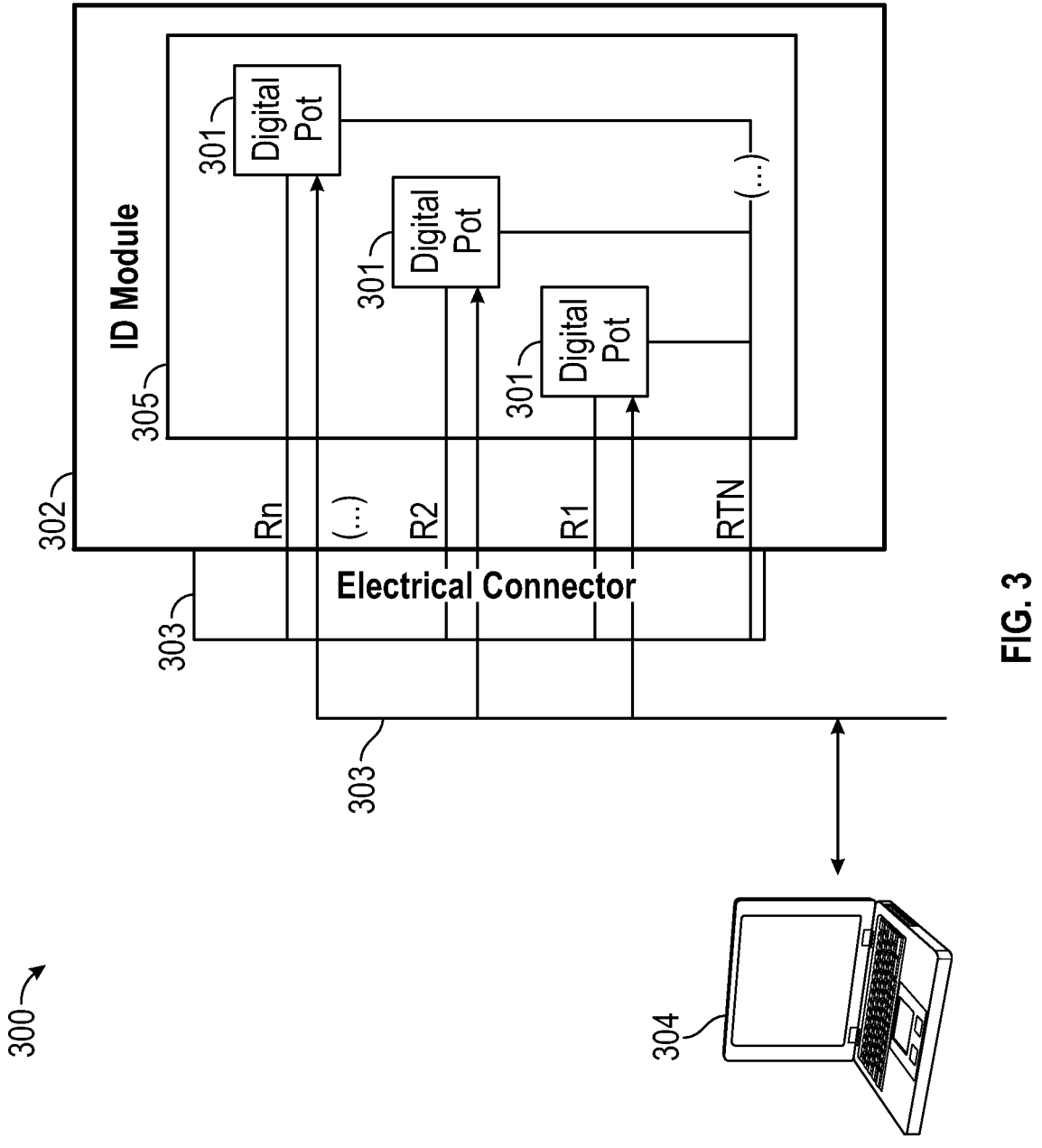
FIG. 3 is a block diagram of a system according to one or more embodiments described herein.
Figure 4:
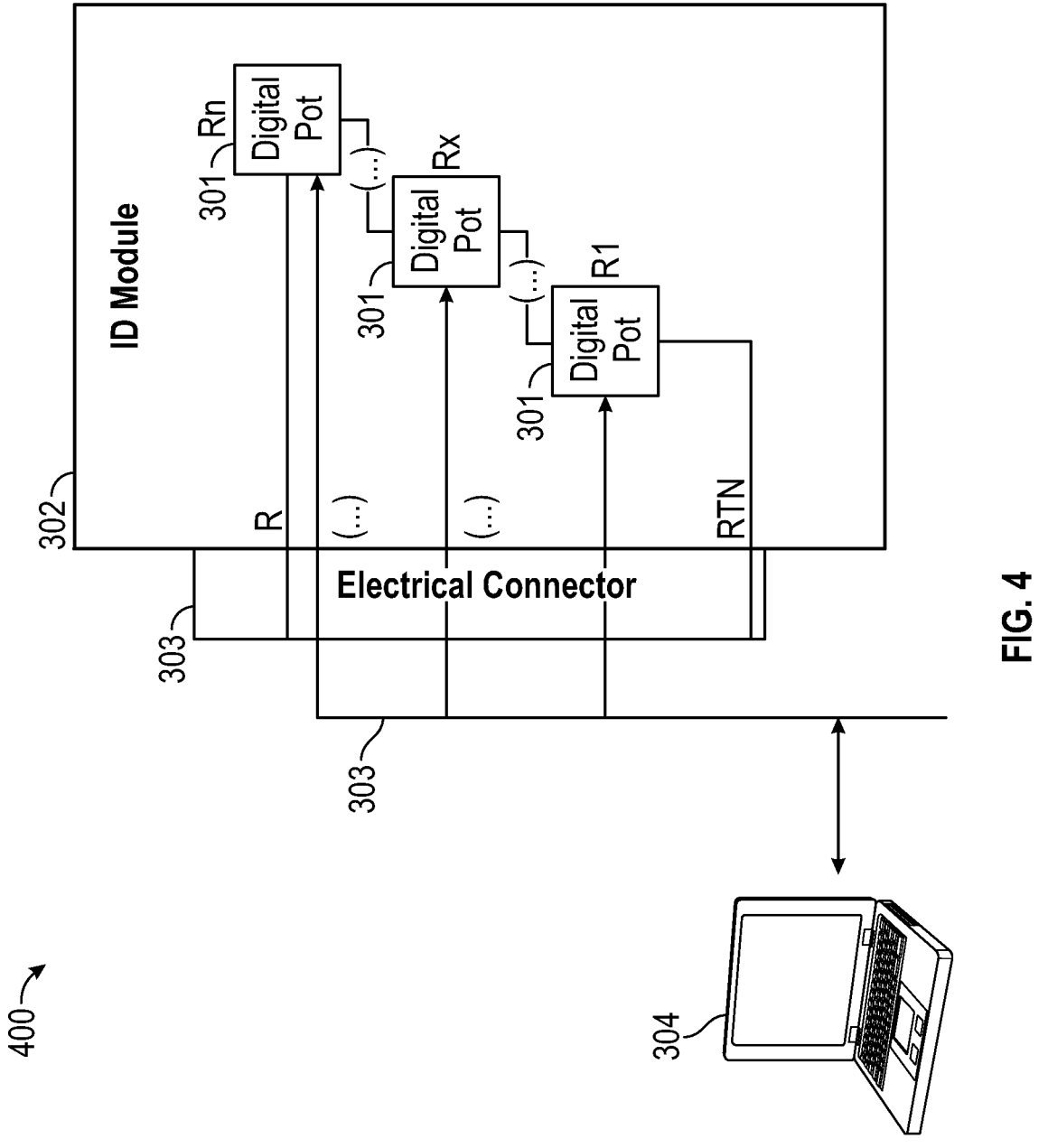
FIG. 4 depicts a block diagram of a system according to one or more embodiments described herein.
Figure 5:
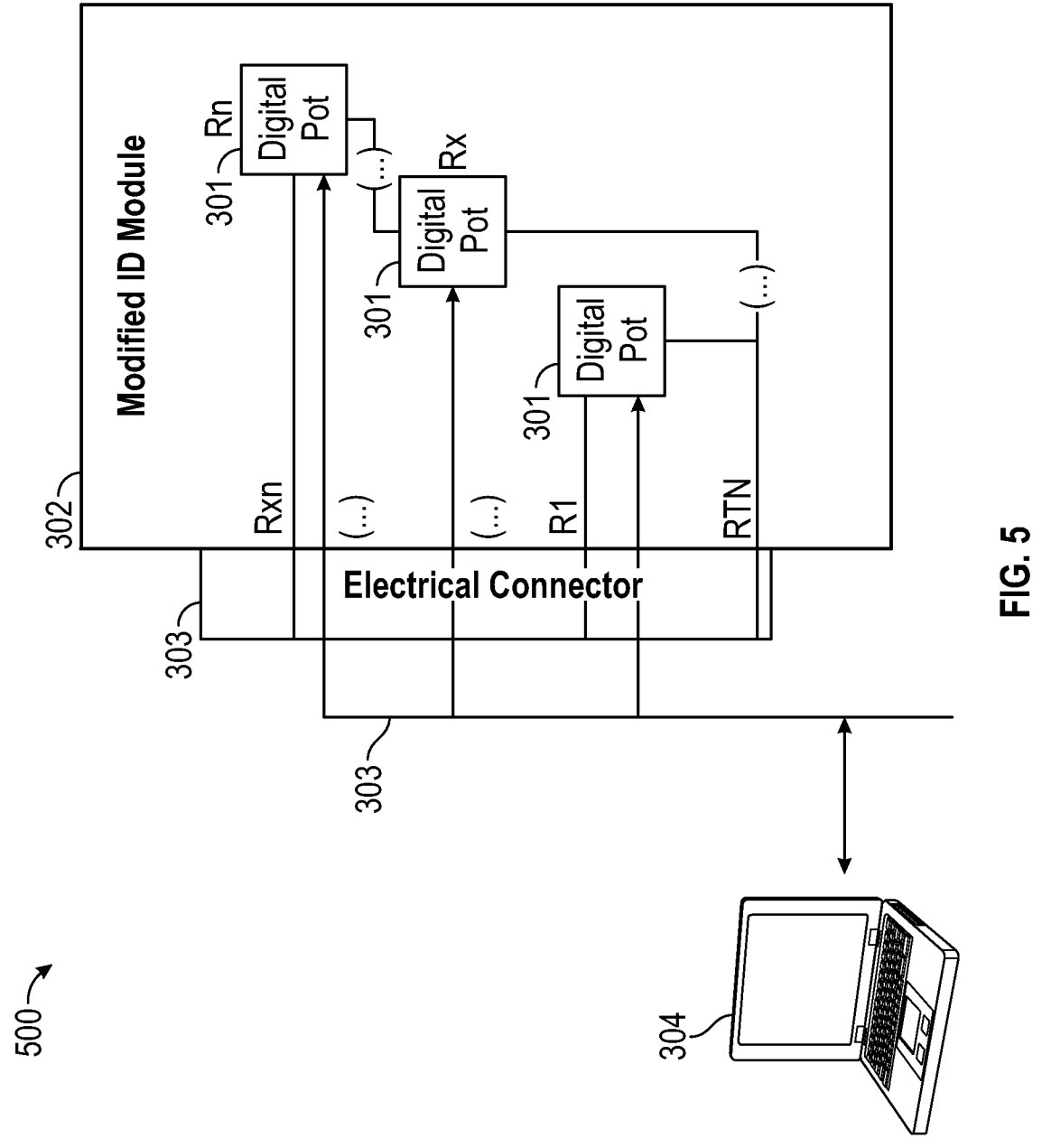
FIG. 5 is a block diagram of a system according to one or more embodiments described herein.

FIGS. 3, 4, and 5 depict different systems 300, 400, 500, respectively, for using an identification module for a turbine engine or APU with extended data storage capacity.

The systems 300, 400, 500 include an ID module 302 that includes a PCB 305 having a plurality of digital potentiometers 301 (or "digital pots" for short). The digital potentiometers 301 can be arranged in different configurations as shown in FIGS. 3-5. For example, in the embodiment of FIG. 3, the digital potentiometers 301 are arranged in parallel. In the embodiment of FIG. 4, the digital potentiometers 301 are arranged in series. In the embodiment of FIG. 5, the digital potentiometers 301 are arranged in a combination of series and parallel. The flexibility provided by the different configurations of the systems 300, 400, 500 provide for configuring the network of digital potentiometers 301 to achieve resistance values respecting the analog input scaling requirements of legacy EECs.

The digital potentiometers 301 are programmable resistors. Different COTS digital potentiometers have different resistance ranges and numbers of taps (e.g., 128, 256, 1024), thereby providing different resolution. The digital potentiometers 301 are installed or mounted on the PCB 305 and embedded in an enclosure that forms the ID module 302. The digital potentiometers 301 can be programmed via an electrical connector 303, which is also used to connect the ID module 302 to the APU control system and EEC. The digital potentiometers 301 can be programmed using a computer 304 with dedicated software, including a graphical user interface for example, that enables a user to input a desired value to be coded (e.g., APU serial number) and software on the computer 304 performs the coding and digital potentiometer programming.

According to one or more embodiments described herein, one or more of the digital potentiometers 301 are reprogrammable such that they are used to store dynamic information that can change through the lifecycle of the APU or turbine engine. Examples of such dynamic information includes an EGT trim, a torque trim, and/or the like, including combinations and/or multiples thereof. According to one or more embodiments described herein, one or more of the digital potentiometers 301 are fusible such that they are fixed once programmed, intended to be used to store static information. Examples of such static information include engine identification data, serial number, and/or the like, including combinations and/or multiples thereof.

The examples of FIGS. 3-5 provide a modular approach to the ID module 302, where the digital potentiometers 301 can be reprogrammed without additional workmanship and hardware manipulation. Moreover, a conventional ID modules are modernized by using modern digital components (e.g., the digital potentiometers 301) which provide benefits such as ease of programming, component availability and the like in a manner that remains transparent to the control system, as the digital potentiometer 301 is perceived by the EEC as a simple resistance. Information stored in the ID module 302 is often read by the EEC once during APU or turbine engine cycle and is re-written to EEC EEPROM. Accordingly, the ID module 302, using the digital potentiometers 301, does not require re-certification of the control system. Also, no changes to the existing legacy control system hardware architecture are required as the ID module 302 can be flexibly adjusted to meet the interface requirements of the legacy EEC. Information in the ID module 302 can be coded in an analog (e.g., look-up table EGT trim vs. resistance) and binary fashion (e.g., serial number).

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An aircraft comprising:
an auxiliary power unit;
a controller; and
an identification module comprising a connector and a plurality of digital potentiometers, the identification module configured to store information about the auxiliary power unit and readable by the controller,
wherein the connector is configured to electrically connect the identification module to the auxiliary power unit, and to program the plurality of digital potentiometers with a desired resistance value via the controller to store analog coded identification (ID) information of the auxiliary power unit and binary coded information indicative of a serial number of the auxiliary power unit, and
wherein the analog coded ID information is generated as a resistance-based coded value that is produced in response to programing at least one digital potentiometer among the plurality of digital potentiometers with the desired resistance value.

2. The aircraft of claim 1, wherein the plurality of digital potentiometers are arranged in a parallel configuration.

3. The aircraft of claim 1, wherein the plurality of digital potentiometers are arranged in a series configuration.

4. The aircraft of claim 1, wherein the plurality of digital potentiometers comprises a first subset of digital potentiometers connected in parallel with each other and a second subset of potentiometers connected in series with each other wherein the first subset is connected in parallel with the second subset.

5. The aircraft of claim 1, wherein at least one of the plurality of digital potentiometers is a reprogrammable digital potentiometer, and wherein at least one other of the plurality of digital potentiometers is a fusible digital potentiometer.

6. The aircraft of claim 1, wherein at least one of the plurality of digital potentiometers stores the serial number of the auxiliary power unit, and wherein at least one other of the plurality of digital potentiometers stores dynamic information associated with the auxiliary power unit.

7. The aircraft of claim 6, wherein the dynamic information associated with the auxiliary power unit comprises an exhaust gas temperature trim or a torque trim.

8. A system comprising:
a turbine engine of an aircraft;
a controller; and
an identification module comprising a plurality of digital potentiometers, the identification module configured to store information about the turbine engine of the aircraft and readable by the controller,
wherein a connector is configured to electrically connect the identification module to the turbine engine, and to program the plurality of digital potentiometers with a desired resistance value via the controller,
wherein the connector is configured to electrically connect the identification module to the turbine engine, and to program the plurality of digital potentiometers via the controller to store analog coded identification (ID) information the turbine engine and binary coded information indicative of a serial number of the turbine engine, and
wherein the analog coded ID information is generated as a resistance-based coded value that is produced in response to programing at least one digital potentiometer among the plurality of digital potentiometers with the desired resistance value.

9. The system of claim 8, wherein the plurality of digital potentiometers are arranged in a parallel configuration.

10. The system of claim 8, wherein the plurality of digital potentiometers are arranged in a series configuration.

11. The system of claim 8, wherein the plurality of digital potentiometers comprises a first subset of digital potentiometers connected in parallel with each other and a second subset of potentiometers connected in series with each other wherein the first subset is connected in parallel with the second subset.

12. The system of claim 8, wherein at least one of the plurality of digital potentiometers is a reprogrammable digital potentiometer, and wherein at least one other of the plurality of digital potentiometers is a fusible digital potentiometer.

13. The system of claim 8, wherein at least one of the plurality of digital potentiometers stores the serial number of the turbine engine.

14. The system of claim 8, wherein at least one of the plurality of digital potentiometers stores dynamic information associated with the turbine engine.

15. The system of claim 14, wherein the dynamic information associated with the turbine engine comprises an exhaust gas temperature trim or a torque trim.

\* \* \* \* \*